United States Patent
Jeong et al.

(10) Patent No.: US 11,995,343 B2
(45) Date of Patent: May 28, 2024

(54) STORAGE DEVICE AND OPERATING METHOD THEREOF

(71) Applicant: SK hynix Inc., Icheon (KR)

(72) Inventors: Jae Woong Jeong, Icheon (KR); In Bo Shim, Icheon (KR); Na Yeong Kim, Icheon (KR); Dal Gon Kim, Icheon (KR)

(73) Assignee: SK hynix Inc., Icheon (KR)

( * ) Notice: Subject to any disclaimer, the term of this patent is extended or adjusted under 35 U.S.C. 154(b) by 49 days.

(21) Appl. No.: 17/736,815

(22) Filed: May 4, 2022

(65) Prior Publication Data
US 2023/0176771 A1 Jun. 8, 2023

(30) Foreign Application Priority Data
Dec. 7, 2021 (KR) .................. 10-2021-0173983

(51) Int. Cl.
*G06F 12/00* (2006.01)
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
USPC ........................................................ 711/154
See application file for complete search history.

(56) References Cited

U.S. PATENT DOCUMENTS

| 2021/0132798 A1* | 5/2021 | McGlaughlin | ........ G06F 3/0683 |
| 2022/0357822 A1* | 11/2022 | He | ........ G06F 3/04886 |

FOREIGN PATENT DOCUMENTS

| DE | 102005051945 A1 * | 6/2006 | ........ G06F 13/4243 |
| EP | 2060976 A1 * | 5/2009 | ............ G06F 11/20 |
| KR | 20020042145 A | 6/2002 | |
| KR | 10-1476463 B1 | 12/2014 | |
| KR | 10-2020-0036700 A | 4/2020 | |

OTHER PUBLICATIONS

Samie B. Samaan et al., "High-speed Serial Bus Repeater Primer", Intel Corporation, Revision 1.2, Oct. 2015.

* cited by examiner

*Primary Examiner* — Mardochee Chery

(57) ABSTRACT

A storage device includes a memory controller and a plurality of memory devices. The plurality of memory devices comprise a first memory device coupled to the memory controller and an $n^{th}$ memory device coupled in series to the first memory device, where n is a natural number greater than 1. The memory controller is configured to transmit, to a first memory device, a signal that includes a target ID indicating a selected memory device from among the plurality of memory devices. Each memory device includes a plurality of memory dies, an interface configured to distribute the signal based on the target ID, and a redriver configured to redrive the signal such that the signal is transferred to another memory device.

18 Claims, 10 Drawing Sheets

STORAGE DEVICE AND OPERATING METHOD THEREOF

CROSS-REFERENCE TO RELATED APPLICATION

The present application claims priority under 35 U.S.C. § 119(a) to Korean Patent Application Number 10-2021-0173983, filed on Dec. 7, 2021, which is incorporated herein by reference in its entirety.

BACKGROUND

Field of Invention

Various embodiments of the present disclosure generally relate to a storage device, and more particularly, to a storage device including a plurality of memory devices and a memory controller.

Description of Related Art

A storage device may store data in response to control of a host device such as a computer or a smartphone. A storage device may include a memory device storing data and a memory controller controlling the memory device. Generally, there are two types of memory devices: volatile memory devices and nonvolatile memory devices.

Volatile memory devices may store data only when power is supplied thereto, and may lose data stored therein when power is not supplied. Examples of volatile memory devices include a Static Random Access Memory (SRAM) device and a Dynamic Random Access Memory (DRAM) device.

Nonvolatile memory devices may retain stored data even when supply of power is interrupted or blocked. Examples of nonvolatile memory devices include a Read Only Memory (ROM) device, a Programmable ROM (PROM) device, an Electrically Programmable ROM (EPROM) device, an Electrically Erasable and Programmable ROM (EEPROM) device, and a flash memory device.

SUMMARY

Various embodiments of the present disclosure provide a storage device having a structure to support high-speed input/output (I/O) and a method of operating the storage device.

According to an embodiment, a storage device may include a first memory device including an interface, a redriver and one or more memory cell arrays, a second memory device and a memory controller configured to transmit, to the first memory device, a signal that includes a target ID indicating a selected memory device, wherein the interface of the first memory device is configured to distribute the signal based on the target ID, and wherein the redriver is configured to receive the signal from the interface and to redrive the signal such that the signal is transferred to the second memory device.

According to an embodiment, a storage device may include a plurality of memory devices each of which includes one or more memory dies, and a memory controller configured to transmit, to a first memory device of the plurality of memory devices, a signal that includes a target ID indicating a selected memory device from among the plurality of memory devices, wherein the first memory device distributes the signal based on the target ID to the one or more memory dies in the first memory device or to a second memory device of the plurality of memory devices when the first memory device receives the signal from the memory controller.

According to an embodiment, a method for operating a storage device may include a plurality of memory devices, the method may include receiving a signal that includes a target ID from a memory controller by a first memory device of the plurality of memory devices, the target ID indicating a selected memory device and redriving the signal to a second memory device of the plurality of memory devices by the first memory device.

DETAILED DESCRIPTION

Specific structural or functional descriptions disclosed herein are merely illustrative and are for the purpose of describing embodiments according to the concept of the present disclosure. The embodiments according to the concept of the present disclosure may be implemented in various forms, and should not be construed as limited to the embodiments set forth herein.

Figure 1:
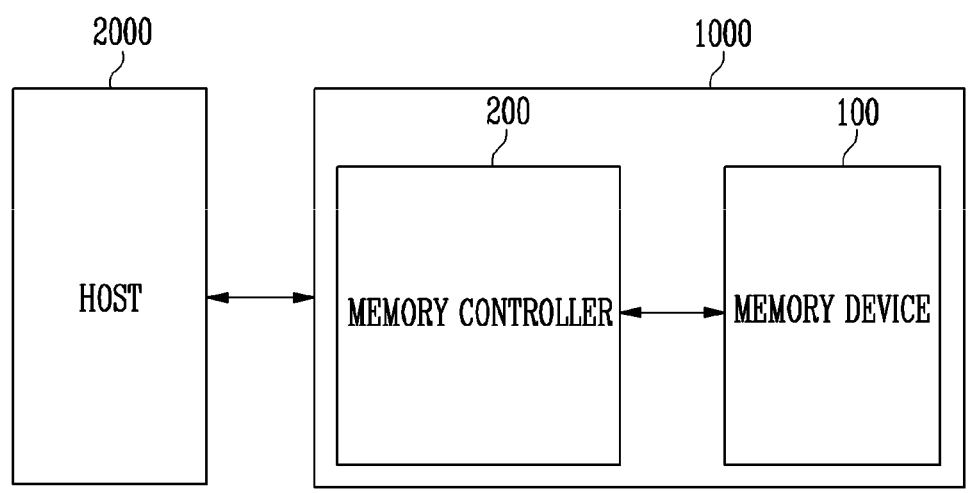
FIG. 1 illustrates a storage device according to an embodiment of the present disclosure.

FIG. 1 illustrates a storage device 1000 according to an embodiment of the present disclosure.

The storage device 1000 may include a memory device 100 and a memory controller 200. In embodiments, the memory device 100 includes a plurality of memory devices.

The storage device 1000 may store data in response to control of a host 2000. Examples of the host 2000 may include a cellular phone, a smartphone, an MP3 player, a laptop computer, a desktop computer, a game player, a display device, a tablet PC, or an in-vehicle infotainment system.

The storage device 1000 may be embodied as one of various types of storage devices according to a host interface corresponding to a communication method with the host 2000. For example, the storage device 1000 may be embodied as one of a solid-state drive (SSD), a multimedia card in the form of a multimedia card (MMC), an embedded MMC (eMMC), a Reduced-Size MMC (RS-MMC), or a micro-MMC, a secure digital card in the form of a secure digital (SD) card, a mini-SD card, or a micro-SD card, a Universal Serial Bus (USB) storage device, a Universal Flash Storage (UFS) device, a Personal Computer Memory Card International Association (PCMCIA) card type storage device, a Peripheral Component Interconnect (PCI) card type storage device, a PCI Express (PCI-e) card type storage device, a compact flash (CF) card, a smart media card, and a memory stick.

The storage device 1000 may be embodied as one of various types of packages. For example, the storage device 1000 may be embodied as one a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data or use stored data. More specifically, the memory device 100 may operate in response to control of the memory controller 200. The memory device 100 may include a plurality of memory dies, and each of the plurality of memory dies may include a memory cell array including a plurality of memory cells storing data.

Each of the memory cells may be configured as a Single-Level Cell (SLC) storing one bit of data, a Multi-Level Cell (MLC) storing two bits of data, a Triple-Level Cell (TLC) storing three bits of data, or a Quad-Level Cell (QLC) storing four bits of data.

The memory cell array may include a plurality of memory blocks. Each of the memory blocks may include a plurality of memory pages and each of the memory pages may include a plurality of memory cells. The page may be a unit for storing data in the memory device 100 or reading data stored in the memory device 100.

The memory device 100 may be embodied as, for example, a Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), NAND flash memory, Vertical NAND flash memory, NOR flash memory, Resistive Random Access Memory (RRAM), Phase-Change Random Access Memory (PRAM), Magnetoresistive Random Access Memory (MRAM), Ferroelectric Random Access Memory (FRAM), or Spin-Transfer Torque Random Access Memory (STT-RAM) device. In examples presented herein, it is assumed that the memory device 100 is a NAND flash memory device.

The memory device 100 may receive a command and an address from the memory controller 200. The memory device 100 may be configured to access an area selected by the received address in the memory cell array. Accessing the selected area may refer to performing an operation corresponding to the received command on the selected area. For example, the memory device 100 may perform a write operation (or a program operation), a read operation, and an erase operation. The program operation may be an operation in which the memory device 100 writes data to the area selected by the address. The read operation may refer to an operation in which the memory device 100 reads data from the area selected by the address. The erase operation may refer to an operation in which the memory device 100 erases data from the area selected by the address.

The memory controller 200 may control general operations of the storage device 1000. More specifically, the memory controller 200 may execute firmware (FW) when power is supplied to the storage device 1000. The firmware (FW) may include a host interface layer (HIL) receiving a request input from the host 2000 or outputting a response to the host 2000, a flash translation layer (FTL) managing an operation between an interface of the host 2000 and an interface of the memory device 100, and a flash interface layer (FIL) providing a command to the memory device 100 or receiving a response from the memory device 100.

The memory controller 200 may receive data and a logical address (LA) from the host 2000 and translate the logical address (LA) into a physical address (PA) indicating addresses of memory cells, in which data is to be stored, included in the memory device 100. The logical address (LA) may include a logical block address (LBA) and the physical address (PA) may include a physical block address (PBA).

The memory controller 200 may control the memory device 100 to perform a program operation, a read operation, or an erase operation in response to a request from the host 2000. During the program operation, the memory controller 200 may provide a program command, a physical block address, and data to the memory device 100. During the read operation, the memory controller 200 may provide a read command and a physical block address to the memory device 100. During the erase operation, the memory controller 200 may provide an erase command and a physical block address to the memory device 100.

The memory controller 200 may control the memory device 100 to perform a program operation, a read operation, or an erase operation independently of the request from the host 2000. For example, the memory controller 200 may control the memory device 100 to perform a program operation, a read operation, or an erase operation used to perform background operations such as wear leveling, garbage collection, and read reclaim.

The host 2000 may communicate with the storage device 1000 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnect (PCI), PCI Express (PCI-e), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
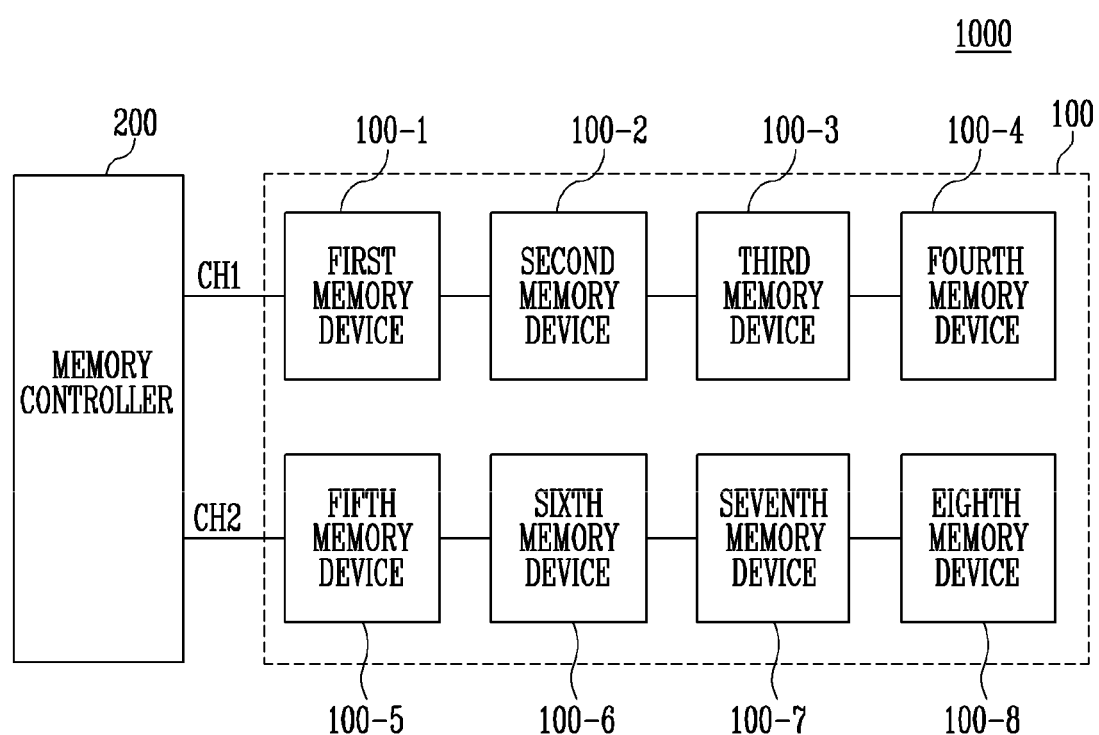
FIG. 2 illustrates a storage device according to an embodiment of the present disclosure.

FIG. 2 illustrates the storage device 1000 according to an embodiment of the present disclosure.

The storage device 1000 may include memory devices 100 and the memory controller 200. The memory devices 100 may include first, second, third, fourth, fifth, sixth, seventh, and eighth memory devices 100-1, 100-2, 100-3, 100-4, 100-5, 100-6, 100-7, and 100-8.

According to an embodiment of the present disclosure, the memory controller 200 may be coupled in series to a plurality of memory devices through one or more channels. For example, as shown in FIG. 2, the memory controller 200 may be coupled to the first memory device 100-1 through a first channel CH1, the first memory device 100-1 may be coupled to the second memory device 100-2, and the second memory device 100-2 may be coupled to the third memory device 100-3. In addition, the third memory device 100-3 may be coupled to the fourth memory device 100-4. In other words, the memory controller 200 may be directly or indirectly coupled to the first memory device 100-1, the second memory device 100-2, the third memory device 100-3, and the fourth memory device 100-4.

Similarly, the memory controller 200 may be directly coupled to the fifth memory device 100-5 through a second channel CH2 and may be indirectly coupled to the sixth memory device 100-6, the seventh memory device 100-7, and the eighth memory device 100-8.

According to an embodiment of the present disclosure, the memory controller 200 may control one of the plurality of memory devices to perform internal operations. The internal operations may include a program operation, a read operation, and an erase operation. For example, the memory controller 200 may transmit a read command to a channel to read a piece of data stored in the third memory device 100-3.

The memory controller 200 may transmit a target ID together with the read command and may indicate, using the target ID, that one of the plurality of memory devices which corresponds to the target ID is a selected memory device to perform the internal operations. For example, the memory controller 200 may transmit a read command together with a target ID indicating that the third memory device 100-3 is the memory device selected to perform a read operation. In other words, the target ID may be information indicating a target or a destination of a signal transmitted by the memory controller 200.

To control the third memory device 100-3 to perform a read operation, the memory controller 200 may transmit a signal including a read command and a target ID to the first memory device 100-1, the first memory device 100-1 may transmit the signal received from the memory controller 200 to the second memory device 100-2, and the second memory device 100-2 may transmit the signal received from the first memory device 100-1 to the third memory device 100-3.

According to an embodiment of the present disclosure, the storage device 1000 may include the memory devices 100 in which components are coupled in series to each other, and the series coupling structure may reduce deterioration (for example, a loading effect) caused by a capacitance (such as an input capacitance) of the components of the memory devices 100.

Figure 3:
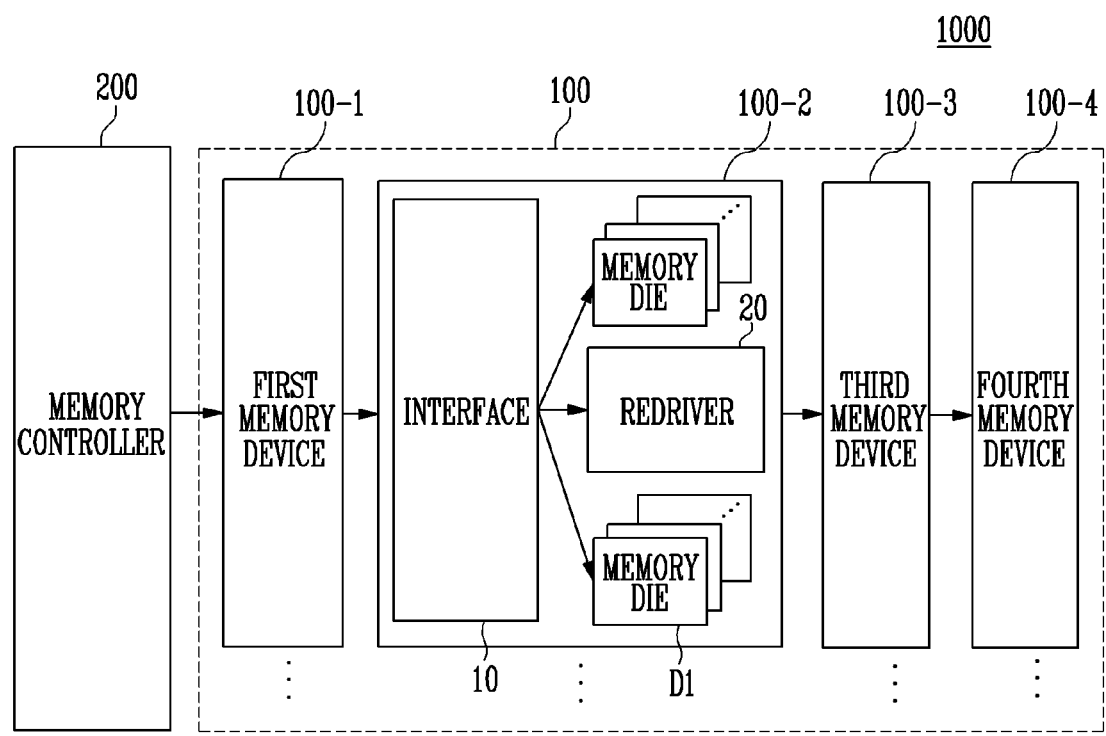
FIG. 3 illustrates a memory device according to an embodiment of the present disclosure.

FIG. 3 illustrates the memory devices 100 according to an embodiment of the present disclosure.

FIG. 3 illustrates a process of transmitting a signal received from the memory controller 200 to a target memory device among a plurality of memory devices included in the memory devices 100.

The memory controller 200 may control one of a plurality of memory devices 100-1, 100-2, 100-3, and 100-4 to perform internal operations. More specifically, the memory controller 200 may transmit a command and a target ID to control one of the plurality of memory devices 100-1, 100-2, 100-3, and 100-4 to the first memory device 100-1. The first memory device 100-1 may identify whether a target memory device for the command is the first memory device 100-1 based on the received target ID. In response to the first memory device 100-1 not identifying itself as the target memory device, the first memory device 100-1 may transmit the command and the target ID received from the memory controller 200 to the second memory device 100-2. The second memory device 100-2 may identify whether the second memory device 100-2 is the target memory device based on the target ID. In response to the second memory device 100-2 not identifying itself as the target memory device, the second memory device 100-2 may transmit the command and the target ID received from the first memory device 100-1 to the third memory device 100-3. By repeating the same process in each successive memory device in the channel, the command and the target ID may be transmitted to the target memory device.

FIG. 3 illustrates only a configuration of the second memory device 100-2 in detail among the plurality of memory devices 100-1, 100-2, 100-3, and 100-4. However, the plurality of memory devices 100-1, 100-2, 100-3, and 100-4 may be formed to have the same structure. Referring to FIG. 3, the second memory device 100-2 may include an interface 10, a plurality of memory dies D1, and a redriver 20.

An interface 10 may receive a signal from an external device and distribute the received signal. More specifically, the interface 10 may identify a target ID in the signal received from the external device. The interface 10 may then check, based on the target ID, whether the memory device including the interface 10 is the target memory device of the received signal. For example, when the second memory device 100-2 receives a target ID and a command from the first memory device 100-1, the interface 10 included in the second memory device 100-2 may identify whether the second memory device 100-2 is the target memory device based on the target ID. In an embodiment, determining whether the target ID identifies a target memory device may be performed by determining whether the target ID matches an inherent ID of the memory device. The identifier of the memory device may, for example, be stored in the device at a previous time or be determined according to the position of the memory device in the chain of memory devices that make up a channel, but embodiments are not limited thereto.

In response to the interface 10 identifying that the memory device in which the interface 10 is included is not the target memory device, the interface 10 may distribute the received signal to a redriver 20 to transmit the received signal to another memory device. In response to the interface 10 identifying that the memory device in which the interface 10 is included is the target memory device, the interface 10 may distribute the received signal to a corresponding memory die D1 included in the memory device in which the interface 10 is included. In other words, the interface 10 may distribute the signal received from the external device to the memory die D1 or the redriver 20 based on the target ID. The interface 10 may include a multiplexer to distribute the signal received from the external device. In embodiments, the interface 10 may distribute the signal as received from the external device (for example, as an analog signal) when distributing the signal to the redriver 20, and may distribute a digitized representation of the signal (such as may be produced using an analog-to-digital converter or a sampler) when distributing the signal to the memory die D1.

The redriver 20 may be a device to compensate for deterioration in signal quality. More specifically, the redriver 20 may be a device to compensate for deterioration which is caused when a signal that is initially transmitted from the memory controller 200 goes through a channel or the memory devices 100 including a plurality of memory devices. For example, when the plurality of memory devices in the memory devices 100 are coupled to the memory controller 200 through a plurality of channels, deterioration in a signal may be caused by capacitances included in the memory devices 100 including the plurality of memory devices or in a circuit. The deterioration in the signal may reduce an input/output (JO) rate of the entire storage device 1000. The redriver 20 may compensate for distortion of a signal which is caused by the plurality of channels or the memory devices 100 including the plurality of memory devices.

Figure 4:
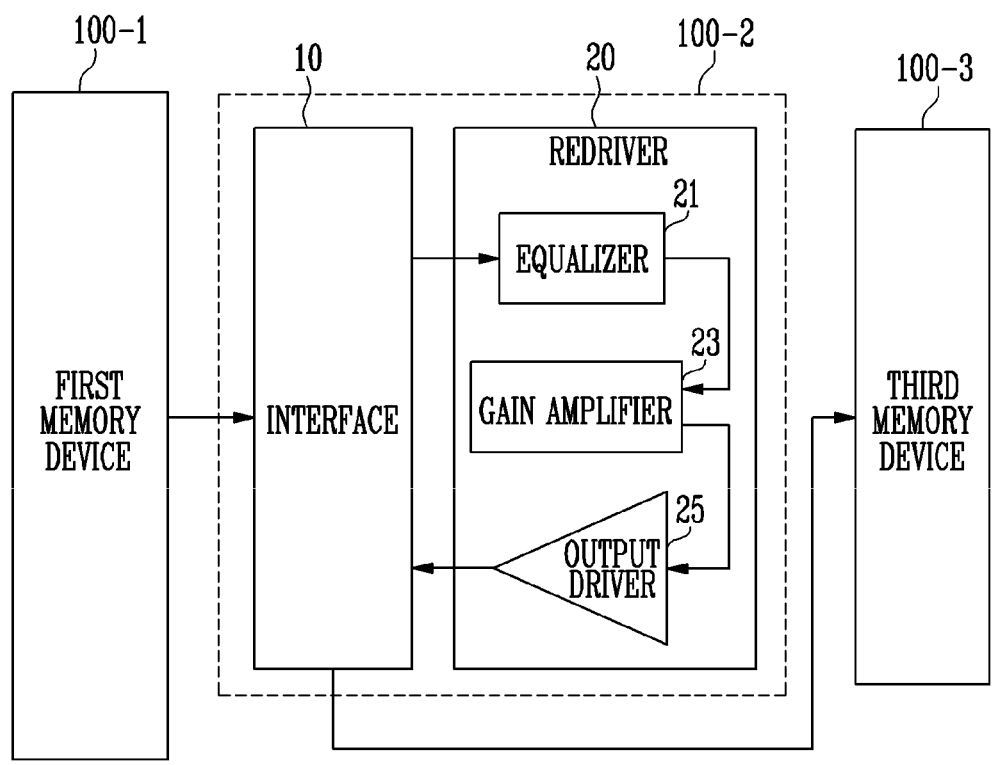
FIG. 4 illustrates a redriver according to an embodiment of the present disclosure.

FIG. 4 illustrates the redriver 20 according to an embodiment of the present disclosure.

FIG. 4 shows a process of transmitting a signal from the first memory device 100-1 to the second memory device 100-2 and from the second memory device 100-2 to the third memory device 100-3. When the second memory device 100-2 receives the signal from the first memory device 100-1, distortion of the signal received from the first memory device 100-1 may be compensated for using the redriver 20. The second memory device 100-2 may then transmit the compensated signal to the third memory device 100-3.

More specifically, the second memory device 100-2 may include the interface 10 to distribute the received signal and the redriver 20 to compensate for any deterioration in signal quality. When the interface 10 checks and identifies, based on a target ID, that the target memory is not the second memory device 100-2, the interface 10 may transmit the signal received from the first memory device 100-1 to the redriver 20.

The redriver 20 may compensate for distortion of the signal received from the interface 10 and may transmit the compensated signal to the third memory device 100-3. More specifically, the redriver 20 may include an equalizer 21, a gain amplifier 23, and an output driver 25. The equalizer 21 may serve as a primary amplifier that amplifies a frequency of a signal. In particular, the equalizer 21 may amplify frequencies higher than a predetermined frequency and may attenuate distortion of a low frequency.

The gain amplifier 23 may serve as a secondary amplifier that amplifies a signal received from the equalizer 21. In particular, the gain amplifier 23 may linearly amplify the signal received from the equalizer 21. The gain amplifier 23 may amplify the received signal to produce a target output of the redriver 20.

The output driver 25 may output the signal produced by the equalizer 21 and the gain amplifier 23 to the interface 10 or another memory device. The output driver 25 may be embodied as a form of an analogue delay circuit which does not include a clock. The output driver 25 may serve as a final amplifier, in particular, an amplifier that amplifies power. In other words, the signal in which the deterioration or the distortion is compensated for may be transmitted to the third memory device 100-3.

Although FIG. 4 shows the redriver 20 including the equalizer 21, the gain amplifier 23, and the output driver 25, in embodiments, each of the equalizer 21, the gain amplifier 23, and the output driver 25 may be omitted and another component that has the same function as each of the equalizer 21, the gain amplifier 23, and the output driver 25 may be added to or may replace each of the equalizer 21, the gain amplifier 23, and the output driver 25.

Figure 5:
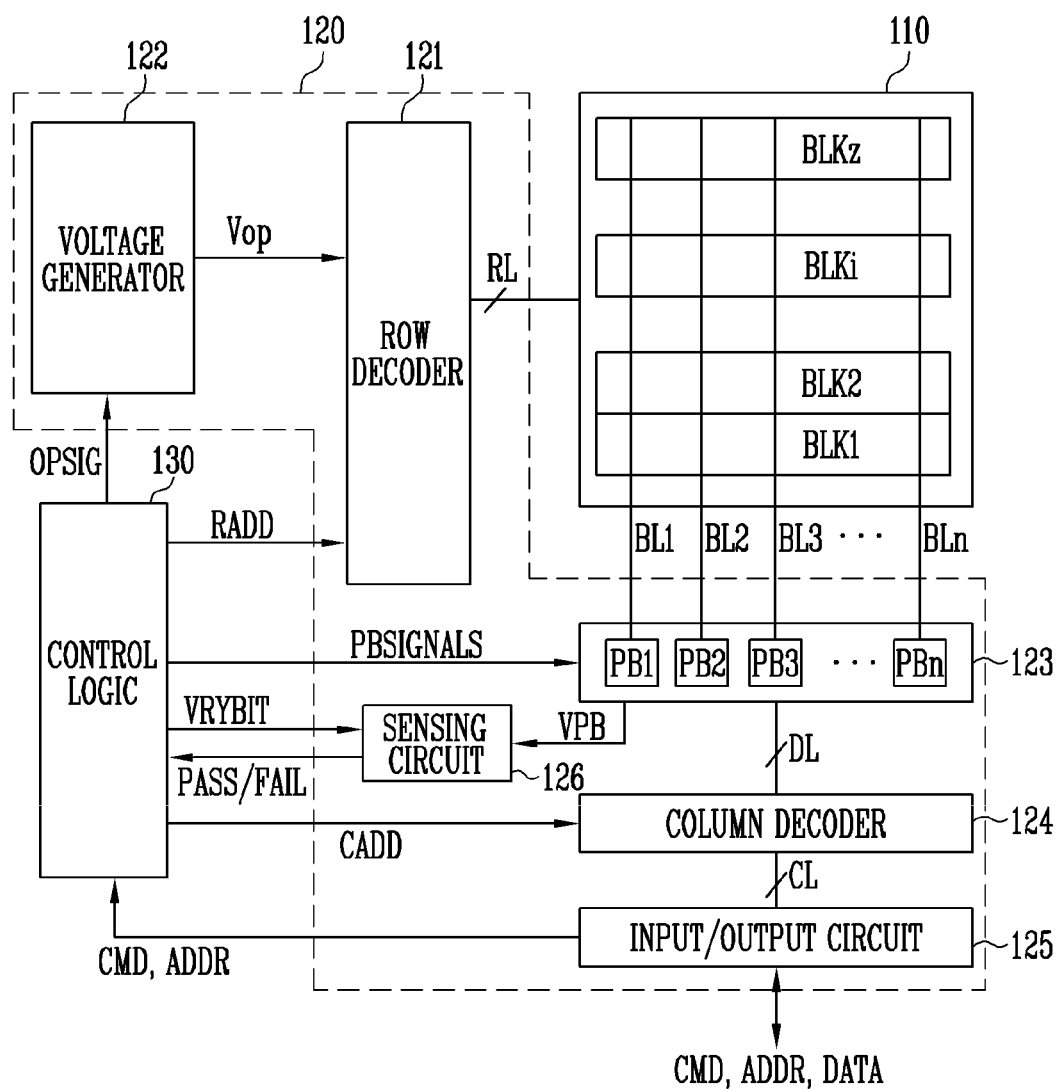
FIG. 5 illustrates a memory die according to an embodiment of the present disclosure.

FIG. 5 illustrates a memory die D1 according to an embodiment of the present disclosure.

The memory die D1 may include a memory cell array 110, a peripheral circuit 120, and control logic 130.

The memory cell array 110 may include a plurality of memory blocks BLK1 to BLKz. The plurality of memory blocks BLK1 to BLKz may be coupled to a row decoder 121 through row lines RL. The row lines RL may include at least one source select line, a plurality of word lines, and at least one drain select line. The plurality of memory blocks BLK1 to BLKz may be coupled to a page buffer group 123 through bit lines BL1 to BLn. Each of the plurality of memory blocks BLK1 to BLKz may include a plurality of memory cells. According to an embodiment, the plurality of memory cells may be nonvolatile memory cells. Memory cells coupled to the same word line may be defined as one page. Therefore, each memory block may include a plurality of pages.

Each of the memory cells included in the memory cell array 110 may be configured as a Single-Level Cell (SLC) storing one bit of data, a Multi-Level Cell (MLC) storing two bits of data, a Triple-Level cell (TLC) storing three bits of data, or a Quad-Level Cell (QLC) storing four bits of data.

The peripheral circuit 120 may be configured to perform a program, read, or erase operation on a selected area of the memory cell array 110 in response to control of the control logic 130. In other words, the peripheral circuit 120 may drive the memory cell array 110 in response to control of the control logic 130. For example, the peripheral circuit 120 may apply various operating voltages to the row lines RL and the bit lines BL1 to BLn or discharge the applied voltages in response to control of the control logic 130.

More specifically, the peripheral circuit 120 may include the row decoder 121, a voltage generator 122, the page buffer group 123, a column decoder 124, an input/output circuit 125, and a sensing circuit 126.

The row decoder 121 may be coupled to the memory cell array 110 through the row lines RL. The row lines RL may include at least one source select line, a plurality of word lines, and at least one drain select line. According to an embodiment, the word lines may include normal word lines and dummy word lines. In addition, the row lines RL may further include a pipe select line.

The row decoder 121 may be configured to operate in response to control of the control logic 130. The row decoder 121 may receive a row address RADD from the control logic 130. More specifically, the row decoder 121 may be configured to decode the row address RADD. The row decoder 121 may select at least one of the memory blocks BLK1 to BLKz according to the decoded row address RADD. In addition, the row decoder 121 may select at least one word line of the selected memory block to apply voltages generated by the voltage generator 122 to at least one word line according to the decoded row address RADD.

For example, during a program operation, the row decoder 121 may apply a program voltage to a selected word line and a program pass voltage having a lower level than the program voltage to unselected word lines. During a program verify operation, the row decoder 121 may apply a verify voltage to the selected word line and a verify pass voltage having a higher level than the verify voltage to the unselected word lines. During a read operation, the row decoder 121 may apply a read voltage to the selected word line and a read pass voltage having a higher level than the read voltage to the unselected word lines.

According to an embodiment, an erase operation of the memory cell array 110 may be performed in units of memory blocks. During the erase operation, the row decoder 121 may select one memory block according to the decoded row address RADD and may apply a ground voltage to word lines coupled to the selected memory block.

The voltage generator 122 may operate in response to control of the control logic 130. More specifically, the voltage generator 122 may be configured to generate a plurality of voltages by using an external power voltage which is supplied to the memory die D1, in response to the control of the control logic 130. For example, the voltage generator 122 may generate a program voltage, a verify voltage, a pass voltage, a read voltage, and an erase voltage in response to the control of the control logic 130. In other words, the voltage generator 122 may generate various operating voltages Vop used to perform program, read and erase operations in response to an operation signal OPSIG.

According to an embodiment, the voltage generator 122 may generate an internal power voltage by regulating an external power voltage. The internal power voltage generated by the voltage generator 122 may be used as an operating voltage of the memory cell array 110.

According to an embodiment, the voltage generator 122 may generate a plurality of voltages by using the external power voltage or the internal power voltage. For example, the voltage generator 122 may include a plurality of pumping capacitors receiving the internal power voltage and generate a plurality of voltages by selectively activating the plurality of pumping capacitors in response to the control of the control logic 130. The plurality of generated voltages may be supplied to the memory cell array 110 by the row decoder 121.

The page buffer group 123 may include first to nth page buffers PB1 to PBn. The first to nth page buffers PB1 to PBn may be coupled to the memory cell array 110 through the first to nth bit lines BL1 to BLn, respectively. In addition, the first to nth page buffers PB1 to PBn may operate in response to the control of the control logic 130. More specifically, the first to nth page buffers PB1 to PBn may operate in response to page buffer control signals PBSIGNALS. For example, the first to nth page buffers PB1 to PBn may temporarily store data received through the first to nth bit lines BL1 to BLn, or may sense voltages or currents of the bit lines BL1 to BLn during a read or verify operation.

More specifically, during a program operation, when a program pulse is applied to a selected word line, the first to nth page buffers PB1 to PBn may transfer data DATA received through the input/output circuit 125 to selected memory cells through the first to nth bit lines BL1 to BLn. Memory cells of a page selected according to the transferred data DATA may be programmed. A memory cell coupled to a bit line to which a program permission voltage (for example, a ground voltage) is applied may have an increased threshold voltage. A threshold voltage of a memory cell coupled to a bit line to which a program inhibition voltage (for example, a power voltage) is applied may be maintained.

During a program verify operation, the first to nth page buffers PB1 to PBn may read page data from the selected memory cells through the first to nth bit lines BL1 to BLn.

During a read operation, the first to nth page buffers PB1 to PBn may read the data DATA from the memory cells of the selected page through the first to nth bit lines BL1 to BLn and output the read data DATA to the input/output circuit 125 in response to control of the column decoder 124.

During an erase operation, the first to nth page buffers PB1 to PBn may float the first to nth bit lines BL1 to BLn.

The column decoder 124 may transfer data between the input/output circuit 125 and the page buffer group 123 in response to a column address CADD. For example, the column decoder 124 may exchange data with the first to nth page buffers PB1 to PBn through data lines DL or may exchange data with the input/output circuit 125 through column lines CL.

The input/output circuit 125 may transfer a command CMD and an address ADDR received from the memory controller 200 to the control logic 130 or may exchange the data DATA with the column decoder 124.

The sensing circuit 126 may generate a reference current in response to an enable bit VRYBIT signal and compare a sensing voltage VPB received from the page buffer group 123 with a reference voltage generated by the reference current to output a pass signal PASS or a fail signal FAIL during a read operation or a verify operation.

The control logic 130 may control the peripheral circuit 120 by outputting the operation signal OPSIG, the row address RADD, the page buffer control signals PBSIGNALS and the enable bit VRYBIT signal in response to the command CMD and the address ADDR.

In addition, the control logic 130 may determine whether a verify operation passes or fails in response to the pass or fail signal PASS or FAIL. In addition, the control logic 130 may control the page buffer group 123 to temporarily store verification information including the pass or fail signal PASS or FAIL. More specifically, the control logic 130 may determine a program state of a memory cell in response to the pass or fail signal PASS or FAIL. For example, when the memory cell configured as a Triple-Level cell (TLC) operates, the control logic 130 may determine the program state of the memory cell as an erase state (E) or one of first to seventh program states (P1 to P7).

Figure 6:
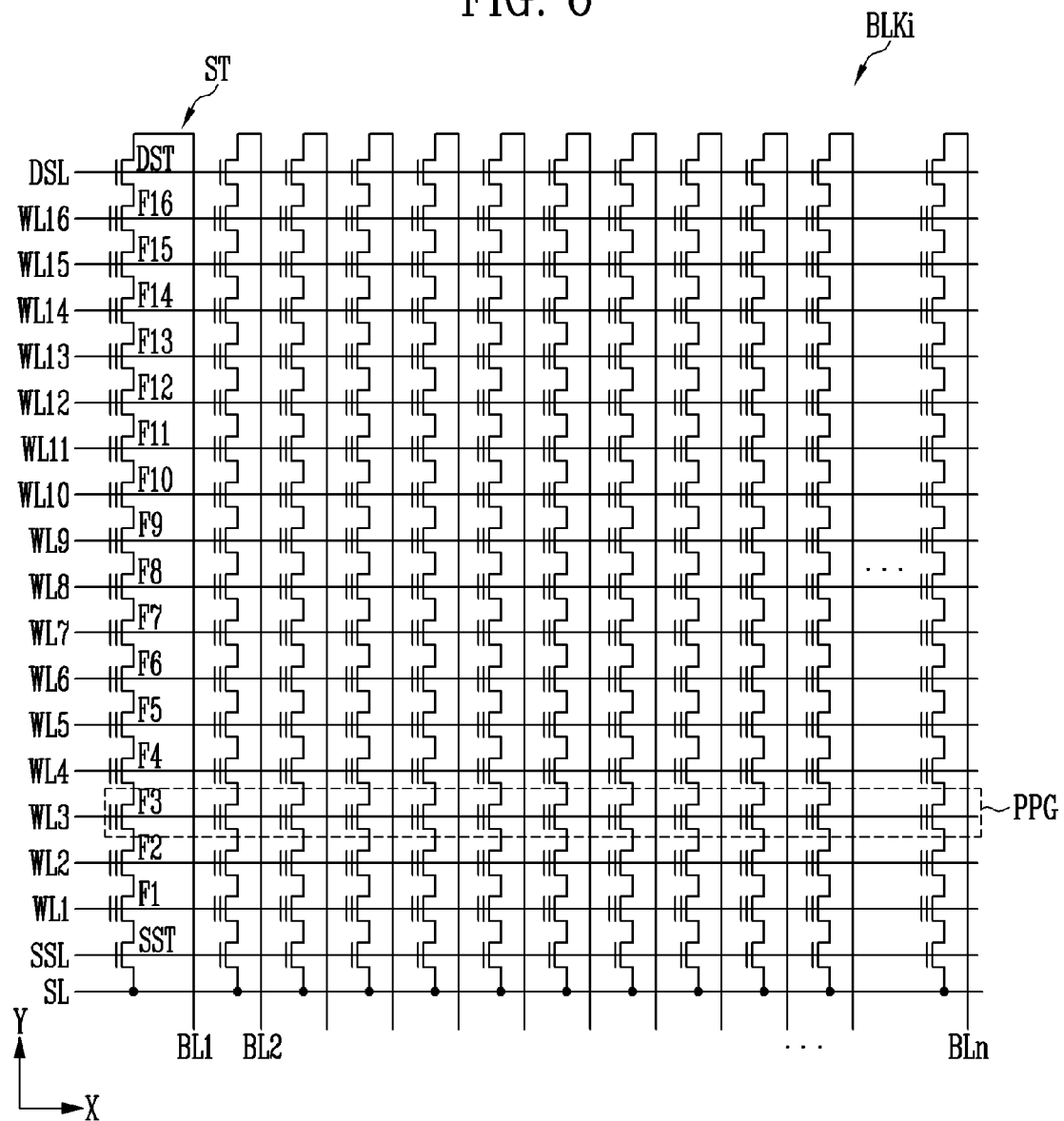
FIG. 6 illustrates a memory block according to an embodiment of the present disclosure.

FIG. 6 illustrates a memory block BLKi according to an embodiment of the present disclosure.

The memory block BLKi may be coupled to a plurality of word lines arranged in parallel between a first select line and a second select line. The first select line may be a source select line SSL and the second select line may be a drain select line DSL. More specifically, the memory block BLKi may include a plurality of strings ST coupled between the bit lines BL1 to BLn and a source line SL. The bit lines BL1 to BLn may be coupled to the strings ST, respectively, and the source line SL may be coupled in common to the strings ST. Because the strings ST may have the same configuration, the string ST coupled to the first bit line BL1 is described below in detail as an example.

The string ST may include a source select transistor SST, a plurality of memory cells F1 to F16, and a drain select transistor DST coupled in series between the source line SL and the first bit line BL1. Each of the strings ST may include at least one source select transistor SST, at least one drain select transistor DST, and more memory cells than the memory cells F1 to F16 shown in FIG. 6.

A source of the source select transistor SST may be coupled to the source line SL and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells F1 to F16 may be coupled to a plurality of word lines WL1 to WL16. A group of memory cells coupled to the same word line, among memory cells included in different strings ST, may be referred to as a physical page PPG. Therefore, the memory block BLKi may include as many physical pages PPG as the number of word lines WL1 to WL16.

Each of the memory cells may be configured as a Single-Level Cell (SLC) storing one bit of data, a Multi-Level Cell (MLC) storing two bits of data, a Triple-Level Cell (TLC) storing three bits of data, or a Quad-Level Cell (QLC) storing four bits of data.

A Single-Level Cell (SLC) may store one bit of data. One physical page PPG of the Single-Level Cell (SLC) may store one logical page (LPG) data. One logical page (LPG) data may include as many bits of data as the number of cells included in one physical page PPG.

A Multi-Level Cell (MLC), a Triple-Level Cell (TLC), and a Quad-Level Cell (QLC) may store two or more bits of data. One physical page PPG may store data corresponding to two or more logical pages (LPG).

Figure 7:
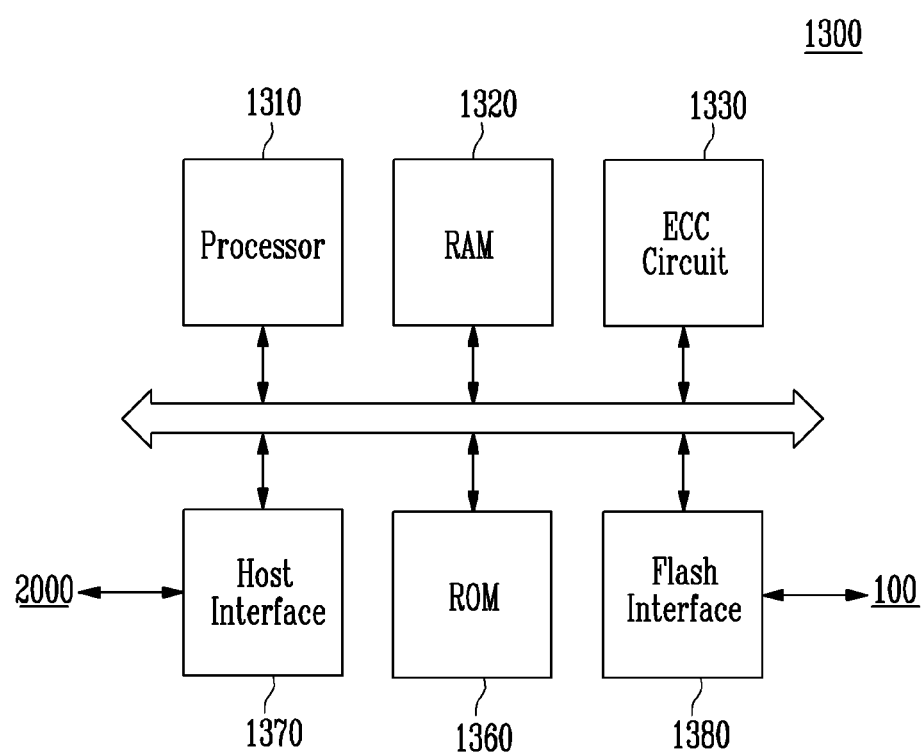
FIG. 7 illustrates a memory controller according to an embodiment of the present disclosure.

FIG. 7 illustrates a memory controller 1300 according to an embodiment of the present disclosure.

The memory controller 1300 may include a processor 1310, RAM 1320, an Error Correction Code (ECC) circuit 1330, ROM 1360, a host interface 1370, and a flash interface

1380. The memory controller 1300 illustrated in FIG. 7 may be an embodiment of the memory controller 200 shown in FIG. 1.

The processor 1310 may communicate with the host 2000 using the host interface 1370 and perform a logical operation to control an operation of the memory controller 1300. For example, the processor 1310 may load a program command, a data file, or a data structure in response to a request received from the host 2000 or an external device, perform various operations, or generate a command and an address. For example, the processor 1310 may generate various commands used for performing a program operation, a read operation, an erase operation, a suspend operation, and a parameter setting operation.

The processor 1310 may perform a function of a flash translation layer (FTL). The processor 1310 may translate a logical block address (LBA), provided by the host 2000, into a physical block address (PBA) through the flash translation layer (FTL). The flash translation layer (FTL) may receive the logical block address (LBA) and translate the logical block address (LBA) into the physical block address (PBA) by using a mapping table. There are various address mapping methods for the flash translation layer (FTL) depending on a mapping unit. Typical address mapping methods include a page mapping method, a block mapping method, and a hybrid mapping method.

The processor 1310 may generate a command without requests from the host 2000. For example, the processor 1310 may generate a command for background operations such as operations for wear leveling of the memory device 100 and operations for garbage collection of the memory device 100.

The RAM 1320 may serve as buffer memory, operational memory, or cache memory of the processor 1310. The RAM 1320 may store codes and commands executed by the processor 1310. The RAM 1320 may store data processed by the processor 1310. When the RAM 1320 is provided, the RAM 1320 may include Static RAM (SRAM) or Dynamic RAM (DRAM).

The ECC circuit 1330 may detect and correct an error during a program operation or a read operation. More specifically, the ECC circuit 1330 may perform an error correction operation according to an Error Correction Code (ECC). The ECC circuit 1330 may perform ECC encoding based on data to be written to the memory device 100. The data to which the ECC encoding is performed may be transferred to the memory device 100 through the flash interface 1380. In addition, the ECC circuit 1330 may perform ECC decoding on data received from the memory device 100 through the flash interface 1380.

The ROM 1360 may serve as a storage unit storing various types of information used for operations of the memory controller 1300. More specifically, the ROM 1360 may include a map table and the map table may store physical-to-logical address information and logical-to-physical address information. The ROM 1360 may be controlled by the processor 1310.

The host interface 1370 may include a protocol for exchanging data between the host 2000 and the memory controller 1300. More specifically, the host interface 1370 may communicate with the host 2000 through at least one of various interface protocols such as Universal Serial Bus (USB), multimedia card (MMC), Peripheral Component Interconnect (PCI), PCI Express (PCI-e), Advanced Technology Attachment (ATA), Serial-ATA (SATA), Parallel-ATA (PATA), Small Computer System Interface (SCSI), Enhanced Small Disk Interface (ESDI), Integrated Drive Electronics (IDE), and private protocols.

The flash interface 1380 may communicate with the memory device 100 using a communication protocol according to control of the processor 1310. More specifically, the flash interface 1380 may communicate a command, an address, and data with the memory device 100 through a channel. For example, the flash interface 1380 may include a NAND interface.

Figure 8:
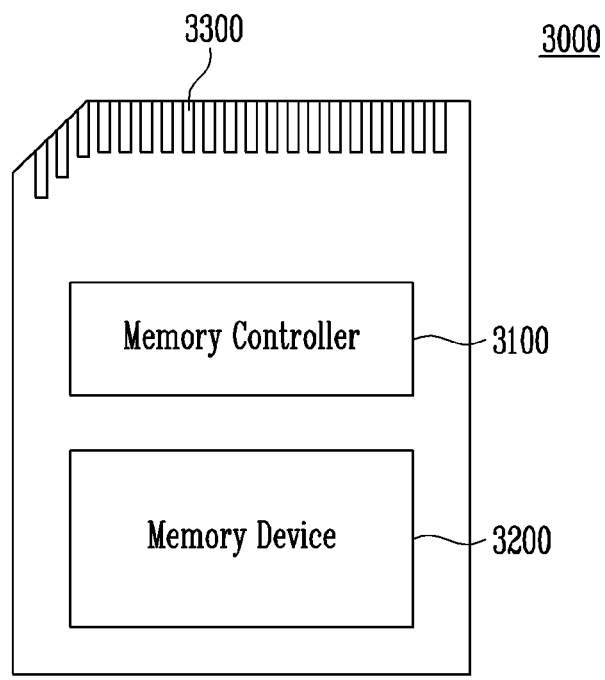
FIG. 8 illustrates a memory card system according to an embodiment of the present disclosure.

FIG. 8 illustrates a memory card system 3000 according to an embodiment of the present disclosure.

The memory card system 3000 may include a memory controller 3100, a memory device 3200, and a connector 3300. Although only one memory device 3200 is shown in FIG. 8, embodiments of the memory card system 3000 may include a plurality of memory devices.

The memory controller 3100 may be electrically coupled to the memory device 3200 and may be configured to access the memory device 3200. For example, the memory controller 3100 may be configured to control a read operation, a write operation, an erase operation, and a background operation of the memory device 3200. The memory controller 3100 may be configured to provide an interface between the memory device 3200 and a host. The memory controller 3100 may run firmware for controlling the memory device 3200.

In an embodiment, the memory controller 3100 may include components such as Random Access Memory (RAM), a processing unit, a host interface, a memory interface, and an error correction code (ECC) block.

The memory controller 3100 may communicate with an external device through the connector 3300. The memory controller 3100 may communicate with the external device (e.g., a host) based on a specific communication protocol. For example, the memory controller 3100 may be configured to communicate with the external device through at least one of various communication protocols such as Universal Serial Bus (USB), multimedia card (MMC), embedded MMC (eMMC), Peripheral Component Interconnect (PCI), PCI Express (PCI-e), Advanced Technology Attachment (ATA), Serial-ATA (SATA), Parallel-ATA (PATA), Small Computer System Interface (SCSI), Enhanced Small Disk Interface (ESDI), Integrated Drive Electronics (IDE), Firewire, Universal Flash Storage (UFS), WiFi, Bluetooth, and Nonvolatile Memory express (NVMe) protocols. In an embodiment, the connector 3300 may be defined by at least one of the above-described various communication protocols.

In an embodiment, the memory device 3200 may be embodied as any of various nonvolatile memory devices such as Electrically Erasable and Programmable ROM (EEPROM), NAND flash memory, NOR flash memory, Phasechange RAM (PRAM), Resistive RAM (ReRAM), Ferroelectric RAM (FRAM), and Spin-Transfer Torque Magnetic RAM (STT-MRAM) devices.

The memory controller 3100 and the memory device 3200 may be integrated into a single semiconductor device to form a memory card. For example, the memory controller 3100 and the memory device 3200 may be integrated into a single semiconductor device and form a memory card such as a personal computer memory card international association (PCMCIA), a compact flash (CF) card, a smart media card (SM or SMC), a memory stick, a multimedia card (MMC, RS-MMC, MMCmicro, or eMMC), an SD card (SD, miniSD, microSD, or SDHC), and a Universal Flash Storage (UFS) device.

Figure 9:
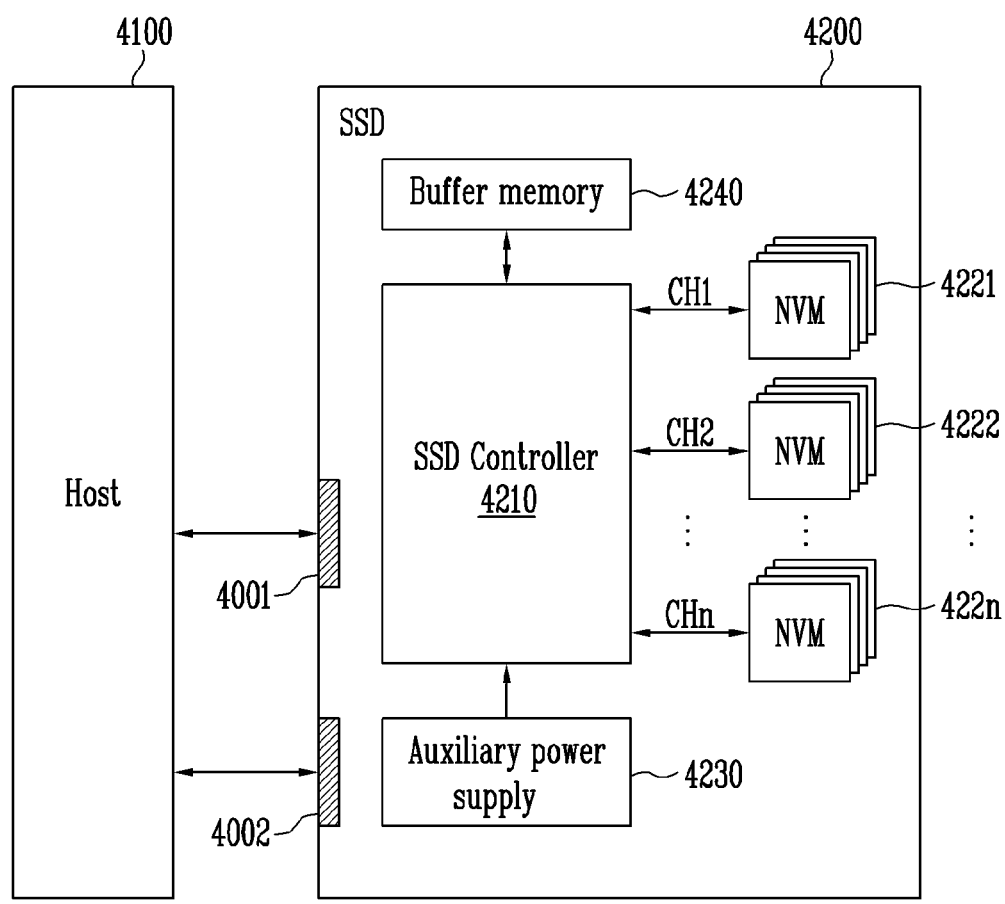
FIG. 9 illustrates a Solid-State Drive (SSD) system according to an embodiment of the present disclosure.

FIG. 9 illustrates a Solid-State Drive (SSD) system 4000 according to an embodiment of the present disclosure.

The SSD system 4000 may include a host 4100 and a Solid-State Drive (SSD) 4200. The SSD 4200 may exchange signals with the host 4100 through a signal connector 4001 and may receive power through a power connector 4002. The SSD 4200 may include an SSD controller 4210, a plurality of flash memory 4221 to 422n, an auxiliary power supply 4230, and buffer memory 4240.

In an embodiment, the SSD controller 4210 may perform the function of the memory controller 200 described above with reference to FIG. 1. The SSD controller 4210 may control the plurality of flash memory 4221 to 422n in response to the signals SIG received from the host 4100. For example, the signals SIG may be signals based on interfaces of the host 4100 and the SSD 4200. For example, the signals SIG may be defined by at least one of various interfaces such as Universal Serial Bus (USB), multimedia card (MMC), embedded MMC (eMMC), Peripheral Component Interconnect (PCI), PCI Express (PCI-e), Advanced Technology Attachment (ATA), Serial-ATA (SATA), Parallel-ATA (PATA), Small Computer System Interface (SCSI), Enhanced Small Disk Interface (ESDI), Integrated Drive Electronics (IDE), Firewire, Universal Flash Storage (UFS), WiFi, Bluetooth, and Nonvolatile Memory express (NVMe) interfaces.

The auxiliary power supply 4230 may be coupled to the host 4100 through the power connector 4002. The auxiliary power supply 4230 may be charged with the power PWR supplied from the host 4100. The auxiliary power supply 4230 may supply the power of the SSD 4200 when power is not smoothly supplied from the host 4100. For example, the auxiliary power supply 4230 may be disposed within or external to the SSD 4200. For example, the auxiliary power supply 4230 may be disposed on a main board and may supply auxiliary power to the SSD 4200.

The buffer memory 4240 may operate as buffer memory of the SSD 4200. For example, the buffer memory 4240 may temporarily store data received from the host 4100 or data received from the plurality of flash memory 4221 to 422n, or may temporarily store metadata (e.g., mapping tables) of the plurality of flash memory 4221 to 422n. The buffer memory 4240 may include volatile memory such as DRAM, SDRAM, DDR SDRAM, LPDDR SDRAM, and GRAM or nonvolatile memory such as FRAM, ReRAM, STT-MRAM, and PRAM.

Figure 10:
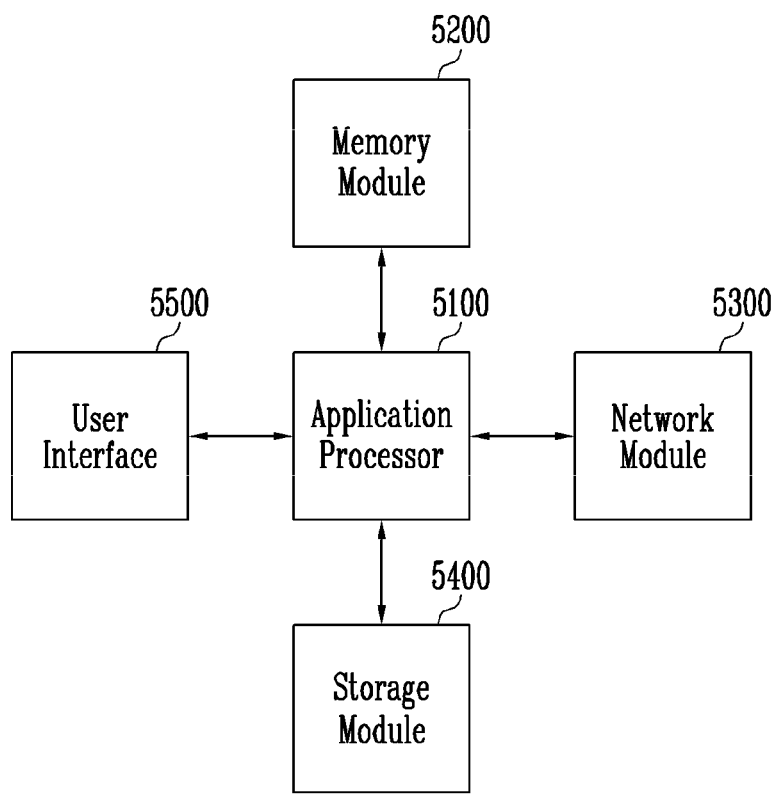
FIG. 10 illustrates a user system according to an embodiment of the present disclosure.

FIG. 10 illustrates a user system 5000 according to an embodiment of the present disclosure.

The user system 5000 may include an application processor 5100, a memory module 5200, a network module 5300, a storage module 5400, and a user interface 5500.

The application processor 5100 may run components included in the user system 5000, an operating system (OS), or a user program. For example, the application processor 5100 may include controllers, interfaces, graphic engines, and the like, for controlling the components included in the user system 5000. The application processor 5100 may be provided as a System-on-Chip (SoC).

The memory module 5200 may function as main memory, operational memory, buffer memory, or cache memory of the user system 5000. The memory module 5200 may include volatile random access memory such as DRAM, SDRAM, DDR SDRAM, DDR2 SDRAM, DDR3 SDRAM, LPDDR SDRAM, LPDDR2 SDRAM, and LPDDR3 SDRAM or nonvolatile random access memory such as PRAM, ReRAM, MRAM, and FRAM. For example, the application processor 5100 and the memory module 5200 may be packaged based on Package on Package (POP) and may then be provided as a single semiconductor package.

The network module 5300 may communicate with external devices. For example, the network module 5300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or Wi-Fi communication. For example, the network module 5300 may be included in the application processor 5100.

The storage module 5400 may store data. For example, the storage module 5400 may store data received from the application processor 5100. Alternatively, the storage module 5400 may transmit the data stored in the storage module 5400 to the application processor 5100. For example, the storage module 5400 may be embodied as a nonvolatile semiconductor memory device, such as Phase-change RAM (PRAM), Magnetic RAM (MRAM), Resistive RAM (RRAM), NAND flash memory, NOR flash memory, or NAND flash memory having a three-dimensional (3D) structure. For example, the storage module 5400 may be provided as a removable storage medium (i.e., removable drive), such as a memory card or an external drive of the user system 5000.

For example, the storage module 5400 may include a plurality of nonvolatile memory devices, and the plurality of nonvolatile memory devices may operate in the same manner as the memory device described above with reference to FIGS. 1 to 5. The storage module 5400 may operate in the same manner as the storage device 1000 described above with reference to FIG. 1.

The user interface 5500 may include interfaces which input data or commands to the application processor 5100 or output data to an external device. For example, the user interface 5500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 5500 may further include user output interfaces such as a Liquid Crystal Display (LCD), an Organic Light Emitting Diode (OLED) display device, an Active Matrix OLED (AMOLED) display device, an LED, a speaker, and a monitor.

According to embodiments of the present disclosure, a storage device having a structure to support high-speed input/output (I/O) and a method of operating the storage device may be provided.

What is claimed is:

1. A storage device, comprising:
   a first memory device including:
   an interface,
   a redriver, and
   one or more memory cell arrays;
   a second memory device directly coupled to the first memory device; and
   a memory controller directly coupled to the first memory device, indirectly coupled to the second memory device through the first memory device, and configured to transmit, to the first memory device, a signal that includes a target ID indicating a selected memory device,
   wherein the interface of the first memory device is configured to distribute the signal based on the target ID, and wherein the redriver is configured to receive the signal from the interface and to redrive the signal such that the signal is transferred to the second memory device.

2. The storage device of claim 1, wherein the interface of the first memory device compares the target ID with an inherent ID of the first memory device in response to the interface of the first memory device receiving the signal.

3. The storage device of claim 2, wherein the target ID corresponding to the inherent ID of a memory device identifies the memory device as the selected memory device, and
wherein the interface of the first memory device distributing the signal includes transferring the signal to a memory cell array among the one or more memory cell arrays of the first memory device when the target ID corresponds to the inherent ID of the first memory device.

4. The storage device of claim 2, wherein the target ID corresponds to the inherent ID when the two are identical, and wherein the interface of the first memory device distributing the signal includes transferring the signal to the redriver of the first memory device when the target ID is not identical to the inherent ID.

5. The storage device of claim 4, wherein the redriver of the first memory device compensates for distortion of the signal received from the interface of the first memory device and outputs the compensated signal to the other memory device.

6. The storage device of claim 1, further comprising:
a third memory device,
wherein the second memory device includes:
an interface configured to receive the signal from the first memory device and distribute the signal based on the target ID,
one or more memory cell arrays, and
a redriver to receive the signal from the interface of the second memory device and to redrive the signal such that the signal is transferred to the third memory device.

7. The storage device of claim 1, further comprising:
a third memory device, the third memory device including:
an interface,
a redriver, and
one or more memory cell arrays; and
a fourth memory device,
wherein the signal is a first signal,
wherein the target ID is a first target ID,
wherein the selected memory device is a first selected memory device,
wherein the memory controller is configured to transmit, to the third memory device, a second signal that includes a second target ID indicating a second selected memory device,
wherein the interface of the third memory device is configured to distribute the second signal based on the second target ID; and
wherein the redriver of the third memory device is configured to receive the second signal from the interface of the third memory device and to redrive the second signal such that the second signal is transferred to the fourth memory device.

8. A storage device, comprising:
a plurality of memory devices each of which includes one or more memory dies; and
a memory controller directly coupled to a first memory device among the plurality of memory devices, indirectly coupled to remaining memory devices except for the first memory device among the plurality of memory devices, and configured to transmit, to the first memory device, a signal that includes a target ID indicating a selected memory device from among the plurality of memory devices,
wherein the first memory device distributes the signal based on the target ID to the one or more memory dies in the first memory device or to a second memory device of the remaining memory devices when the first memory device receives the signal from the memory controller.

9. The storage device of claim 8, wherein the first memory device comprises:
an interface configured to distribute the signal received from the memory controller based on the target ID; and
a redriver configured to redrive the signal such that the signal is transferred to the second memory device.

10. The storage device of claim 9, wherein the interface compares the target ID with an inherent ID of the first memory device when the interface receives the signal.

11. The storage device of claim 10, wherein the interface distributes the signal to a memory die corresponding to the signal among the one or more memory dies of the first memory device when the target ID corresponds to the inherent ID.

12. The storage device of claim 10, wherein the interface distributes the signal to the redriver when the target ID does not correspond to the inherent ID.

13. The storage device of claim 10, wherein the redriver compensates for distortion of the signal received from the interface and outputs the compensated signal to the second memory device.

14. The storage device of claim 8, wherein the plurality of memory devices are coupled in series to the memory controller.

15. The storage device of claim 8,
wherein the second memory device distributes the signal based on the target ID to the one or more memory dies in the second memory device or to a third memory device of the plurality of memory devices when the second memory device receives the signal from the first memory device.

16. A method for operating a storage device including a plurality of memory devices and a memory controller directly coupled to a first memory device among the plurality of memory devices, indirectly coupled to remaining memory devices except for the first memory device among the plurality of memory devices, and controlling the plurality of memory devices, the method comprising:
receiving a signal that includes a target ID from the memory controller by the first memory device, the target ID indicating a selected memory device of the plurality of memory devices; and
redriving the signal such that the signal is transferred to a second memory device of the remaining memory devices by the first memory device.

17. The method of claim 16, further comprising:
transferring the signal to a memory cell array of the second memory device when the target ID corresponds to an inherent ID of the second memory device.

18. The method of claim 16, further comprising:
redriving the signal to a third memory device of the remaining memory devices by the second memory device; and transferring the signal to a memory cell array of the third memory device when the target ID corresponds to an inherent ID of the third memory device.

\* \* \* \* \*